United States Patent
Arell

(10) Patent No.: US 10,177,721 B2
(45) Date of Patent: *Jan. 8, 2019

(54) INTEGRATED RF LIMITER

(71) Applicant: Skyworks Solutions, Inc., Woburn, MA (US)

(72) Inventor: Thomas William Arell, Basking Ridge, NJ (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/663,322

(22) Filed: Jul. 28, 2017

(65) Prior Publication Data

US 2018/0019714 A1 Jan. 18, 2018

Related U.S. Application Data

(63) Continuation of application No. 14/957,101, filed on Dec. 2, 2015, now Pat. No. 9,755,587.

(60) Provisional application No. 62/087,154, filed on Dec. 3, 2014.

(51) Int. Cl.
| | |
|---|---|
| H03G 3/30 | (2006.01) |
| H03F 1/52 | (2006.01) |
| H03F 3/193 | (2006.01) |
| H03F 3/195 | (2006.01) |
| H03G 7/00 | (2006.01) |
| H03G 11/00 | (2006.01) |

(52) U.S. Cl.
CPC ............. *H03F 1/523* (2013.01); *H03F 3/193* (2013.01); *H03F 3/195* (2013.01); *H03G 7/00* (2013.01); *H03G 11/00* (2013.01); *H03F 2200/211* (2013.01); *H03F 2200/444* (2013.01); *H03F 2200/451* (2013.01)

(58) Field of Classification Search
CPC ... H03F 3/68; H03G 3/20; H03G 3/30; H03G 3/3036; H03G 3/3042
USPC ...................... 330/124 R, 144, 145, 284, 295
See application file for complete search history.

(56) References Cited

U.S. PATENT DOCUMENTS

| | | | |
|---|---|---|---|
| 5,301,081 A | 4/1994 | Podell et al. | |
| 7,015,519 B2 | 3/2006 | Krutko et al. | |
| 7,567,122 B2 | 7/2009 | Sowlati | |
| 8,624,670 B2 | 1/2014 | Woo | |
| 9,755,587 B1 * | 9/2017 | Arell | ........................ H03F 1/523 |
| 2008/0290951 A1 | 11/2008 | Inoue et al. | |
| 2015/0349720 A1 | 12/2015 | Staudinger et al. | |

* cited by examiner

*Primary Examiner* — Steven J Mottola
(74) *Attorney, Agent, or Firm* — Knobbe, Martens, Olson & Bear, LLP

(57) ABSTRACT

A limiter circuit is integrated into an RF power amplifier. The limiter circuit automatically starts adding attenuation at the input of the RF power amplifier after a predetermined input power level threshold is exceeded, thereby extending the safe input drive level to protect the amplifier. In a preferred embodiment of the invention, the limiter circuit is implemented using a pseudomorphic high electron mobility transistor (PHEMT) device or a metal semiconductor field effect transistor (MESFET) device. Diode connected transistors or Schottky diodes may also be used in the limiter circuit.

24 Claims, 4 Drawing Sheets

INTEGRATED RF LIMITER

CROSS REFERENCE TO RELATED APPLICATION

This application is a continuation of U.S. application Ser. No. 14/957,101, filed on Dec. 2, 2015 and titled "INTEGRATED RF LIMITER", which is hereby incorporated by reference in its entirety herein and which claims benefit of provisional application Ser. No. 62/087,154, filed Dec. 3, 2014, which application is incorporated by reference herein in its entirety.

BACKGROUND

Radio frequency (RF) power amplifiers are sometimes subjected to input RF overdrive conditions, typically during a calibration procedure for cell phone applications. This overdrive condition can be destructive depending on other factors such as supply voltage and output load voltage standing wave ratio (VSWR).

SUMMARY

A limiter circuit is integrated into an RF power amplifier. The limiter circuit automatically starts adding attenuation at the input of the RF power amplifier after a predetermined input power level threshold is exceeded, thereby extending the safe input drive level to protect the amplifier. In a preferred embodiment of the invention, the limiter circuit is implemented using a pseudomorphic high electron mobility transistor (PHEMT) device or a metal semiconductor field effect transistor (MESFET) device. Diode connected transistors or Schottky diodes may also be used in the limiter circuit.

BRIEF DESCRIPTION OF DRAWING

These and other objects, features and advantages of the invention will be more readily apparent from the following detailed description in which.

DETAILED DESCRIPTION

Figure 1:
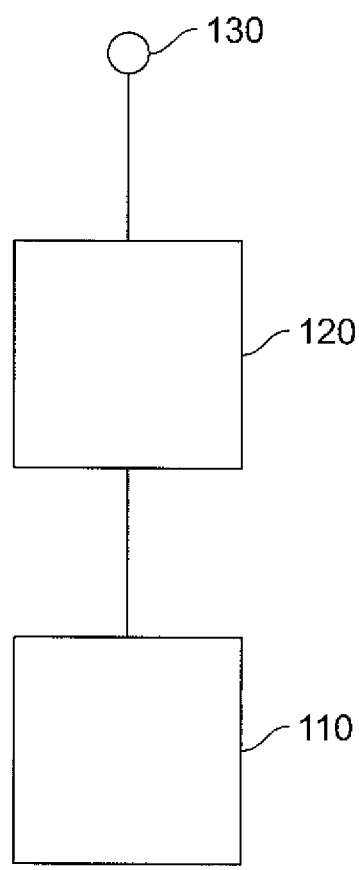
FIG. 1 is a block diagram of a first illustrative embodiment of the present invention.

FIG. 1 is a block diagram of an illustrative embodiment of the input section of a power amplifier of the invention such as might be used in a cellular phone. The input section comprises a power amplifier stage 110 and a limiter circuit 120. Illustratively, the power amplifier stage comprises a heterojunction bipolar transistor (HBT) having an emitter, a base and a collector. The limiter circuit 120 comprises at least a first PHEMT or MESFET coupled between an RF signal input 130 and the base of the HBT. In addition, the limiter circuit may include one or more additional diode-connected PHEMTs or MESFETs coupled between the first PHEMT or MESFET and the collector of the HBT.

Figure 2:
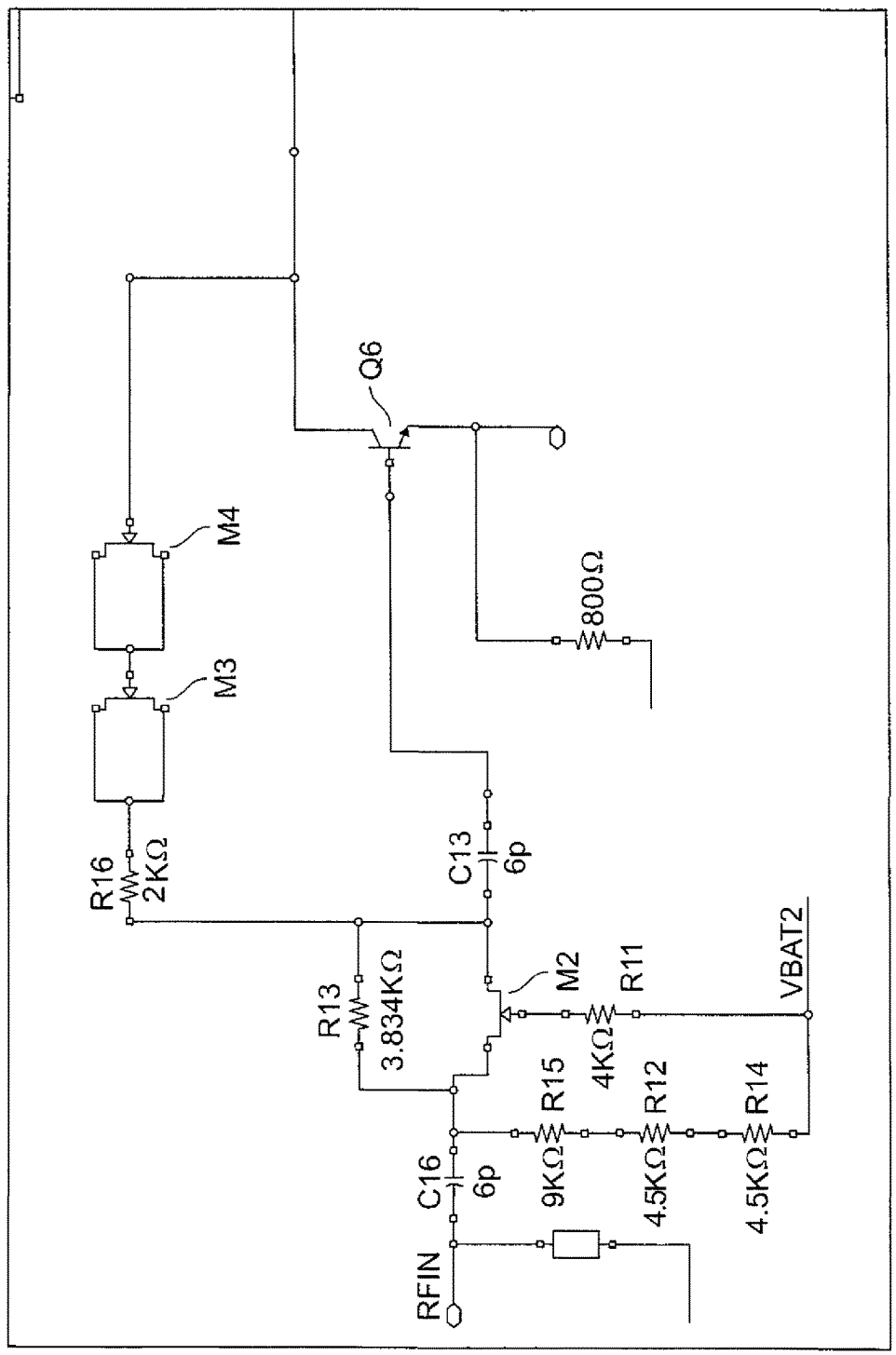
FIG. 2 is a schematic diagram of the first illustrative embodiment of the present invention.
Figure 3:
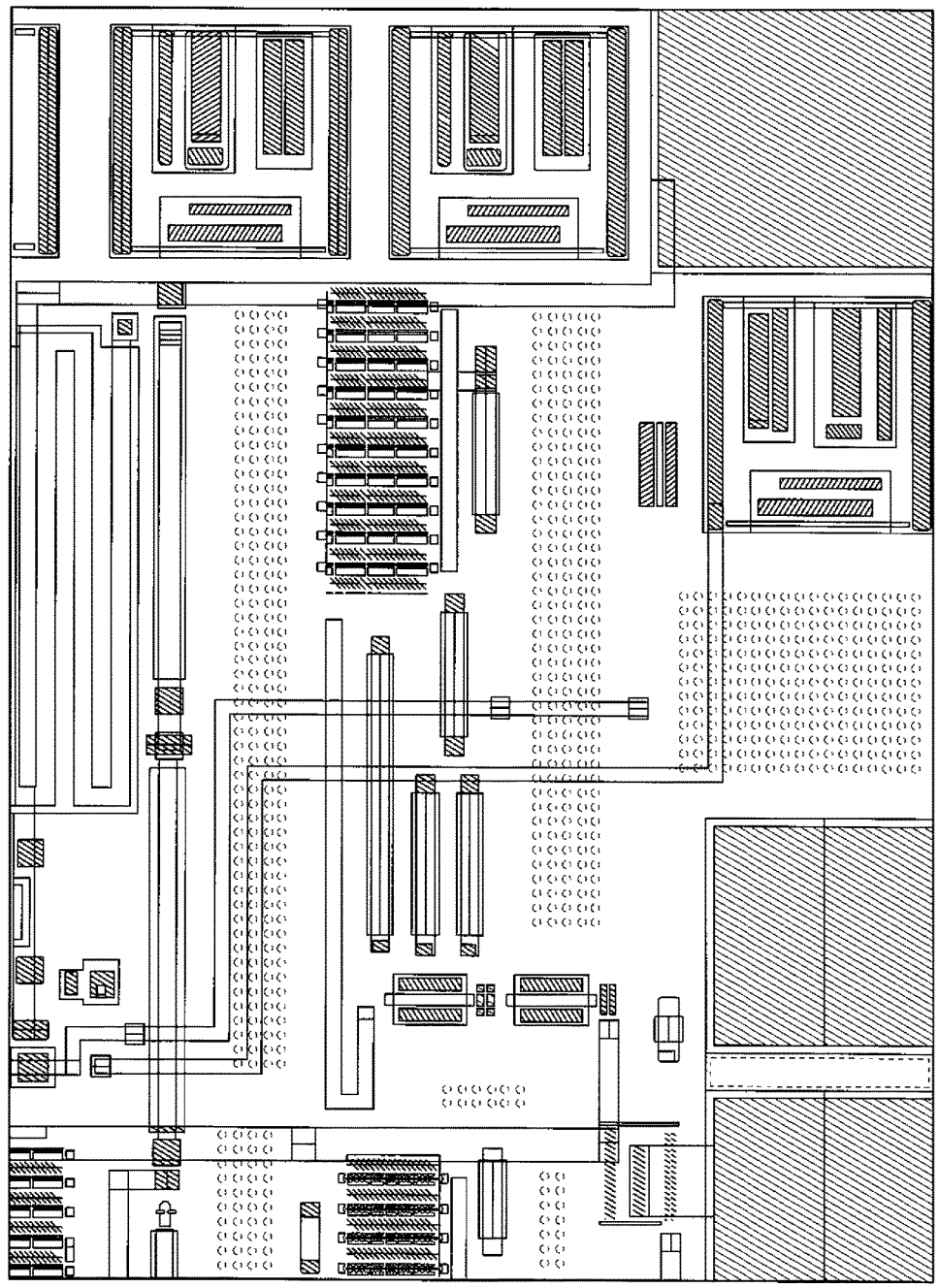
FIG. 3 is a layout of the first illustrative embodiment of the present invention.

FIG. 2 is a schematic depicting an illustrative embodiment of the input section of a cellular power amplifier with the integrated RF limiter of FIG. 1. The power amplifier stage comprises HBT Q6 having an emitter, a base and a collector. The limiter circuitry comprises: first PHEMT M2, second and third PHEMTs M3 and M4 connected as diodes, DC blocking capacitors C16 and C13, gate resistor R11, drain to source resistor R13, drain to supply resistor (sum of R15, R12, R14), and resistor R16 in series with detector diodes PHEMT M3 and M4. PHEMT M4 is connected to the collector of HBT RF stage Q6.

With RF applied to "RFIN" in the normal operational input power range, M2 is biased to be in a fully on low loss state. When the input level reaches a certain power level determined by the combination of the diodes, resistors and the RF gain of the first stage (Q6), the source and drain voltage of M2 will increase to become more positive relative to the gate causing M2 to start pinching off or go into a high loss state.

Figure 4:
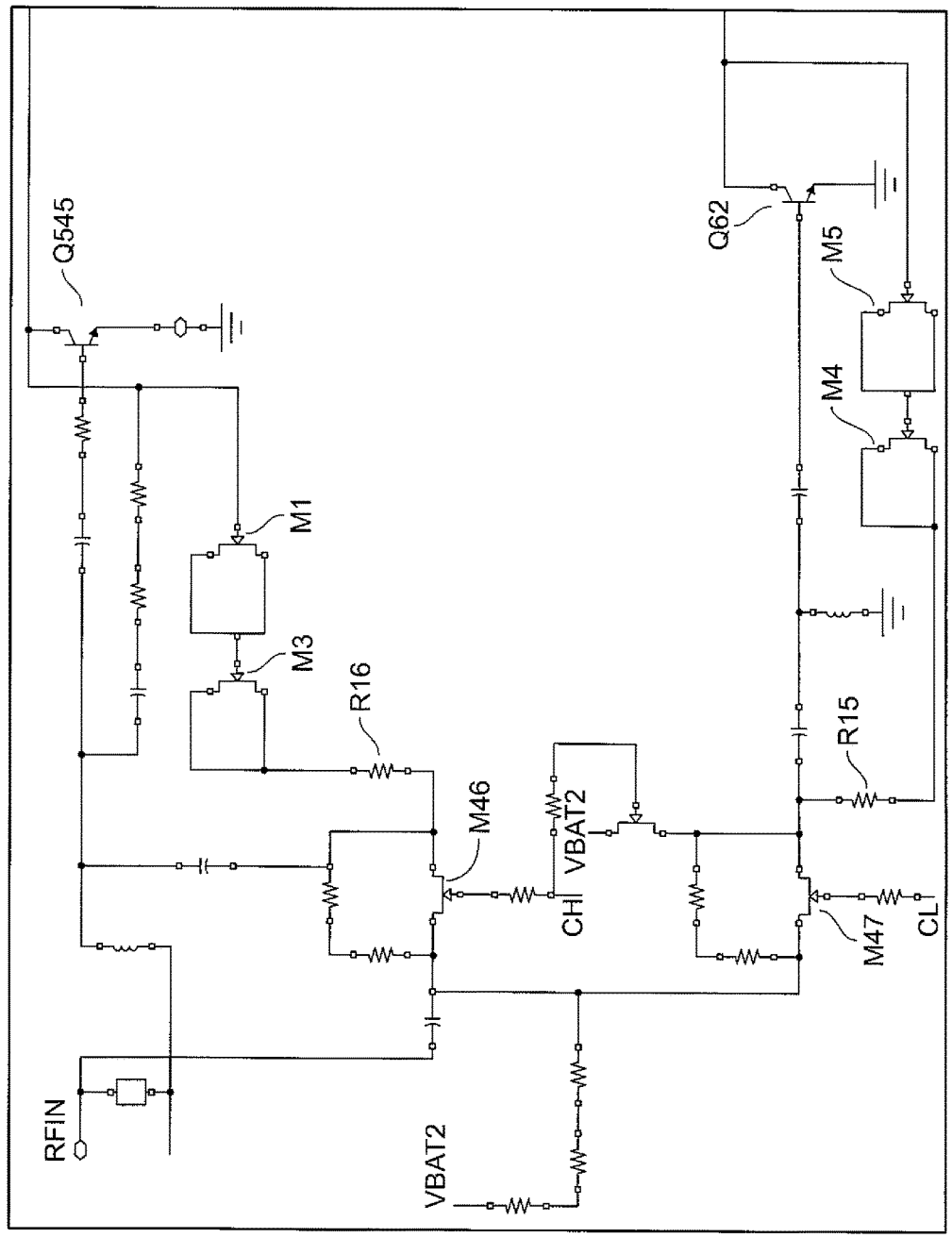
FIG. 4 is a schematic diagram of a second illustrative embodiment of the present invention

FIG. 4 is a schematic drawing depicting an alternate implementation where the power amplifier architecture has two paths, high power and low power, using a SP2T switch. The high power path includes a power amplifier stage comprising HBT Q545, and a limiter circuit comprising diodes M1 and M3 and PHEMT M46. The low power path includes a power amplifier stage comprising HBT Q62; and a limiter circuit comprising detector diodes M4 and M5 and PHEMT M47. Detector diodes M1 and M3 and resistor R16 are used to raise the drain source voltage of PHEMT switch M46 for high power path and detector diodes M4 and M5 and resistor R15 similarly raise the drain source voltage for PHEMT M47 for the low power path.

As shown in FIG. 4, the diodes are implemented using diode coupled PHEMT. Alternatively, MESFETs could be used in place of the PHEMTs or Schottky barrier diodes could be used in place of the PHEMTs or MESFETs.

Illustratively, the HBT and field effect transistor (FET) devices are formed in a III-V semiconductor material such as Gallium Nitride, Indium Phosphide, or Gallium Arsenide/Indium Gallium Phosphide. In some applications, it may be advantageous to integrate the HBT and the FET device in a single semiconductor crystal by epitaxially growing the HBT device on an epitaxially grown FET device. Such a device and the process for making it in a GaAs/InGaP epitaxial growth process is described in U.S. Pat. No. 7,015,519, which is incorporated herein by reference. Other materials may also be used.

As will be apparent to those skilled in the art, numerous variations may be practiced within the spirit and scope of the present invention.

What is claimed is:

1. A power amplifier comprising:
    a power amplifier stage; and
    a limiter circuit connected to an input of the power amplifier stage, the limiter circuit including at least a first pseudomorphic high electron mobility transistor and at least a first diode connected between the first pseudomorphic high electron mobility transistor and an output of the power amplifier stage.

2. The power amplifier of claim 1 wherein, responsive to an input power level threshold being satisfied, the limiter circuit adds attenuation at the input of the power amplifier stage.

3. The power amplifier of claim 1 wherein the power amplifier stage includes at least one heterojunction bipolar transistor.

4. The power amplifier of claim 3 wherein the first pseudomorphic high electron mobility transistor is connected between a base of the at least one heterojunction bipolar transistor and the input of the power amplifier stage.

5. The power amplifier of claim 1 wherein the power amplifier stage is one stage of a multi-stage power amplifier.

6. The power amplifier of claim 1 wherein the limiter circuit includes at least one metal semiconductor field effect transistor.

7. The power amplifier of claim 1 wherein the first diode is a Schottky barrier diode.

8. The power amplifier of claim 1 wherein the first diode is a second pseudomorphic high electron mobility transistor configured as a diode.

9. The power amplifier of claim 8 wherein the first diode is connected in series with a third pseudomorphic high electron mobility transistor configured as a diode.

10. The power amplifier of claim 1 wherein the power amplifier stage is configured to amplify a radio frequency signal.

11. The power amplifier of claim 1 wherein the power amplifier stage is associated with a communication path of a first power level and the power amplifier further comprises a second power amplifier stage associated with a communication path of a second power level.

12. The power amplifier of claim 11 further comprising a second limiter circuit connected to an input of the second power amplifier stage.

13. The power amplifier of claim 12 wherein, responsive to a second input power level threshold being satisfied, the second limiter circuit adds attenuation at the input of the second power amplifier stage.

14. The power amplifier of claim 1 wherein the limiter circuit includes at least one field effect transistor and at least one heterojunction bipolar transistor integrated on a single die.

15. The power amplifier of claim 14 wherein the single die is formed using an epitaxial growth process.

16. A cellular phone comprising:
an antenna; and
a power amplifier including a power amplifier stage and a limiter circuit connected to an input of the power amplifier stage, the limiter circuit including at least a first pseudomorphic high electron mobility transistor and at least a first diode connected between the first pseudomorphic high electron mobility transistor and an output of the power amplifier stage.

17. The cellular phone of claim 16 wherein, responsive to an input power level threshold being satisfied, the limiter circuit adds attenuation at the input of the power amplifier stage.

18. The cellular phone of claim 16 wherein the power amplifier stage includes at least one heterojunction bipolar transistor and the first pseudomorphic high electron mobility transistor is connected between a base of the at least one heterojunction bipolar transistor and the input of the power amplifier stage.

19. The cellular phone of claim 16 wherein the first diode is a second pseudomorphic high electron mobility transistor with a source and a drain of the second pseudomorphic high electron mobility transistor connected together.

20. The cellular phone of claim 16 wherein the power amplifier includes one or more additional power amplifier stages associated with a different power level than the power amplifier stage.

21. The cellular phone of claim 16 wherein the limiter circuit includes at least one metal semiconductor field effect transistor.

22. The cellular phone of claim 16 wherein the first diode is a Schottky barrier diode.

23. The cellular phone of claim 16 wherein the power amplifier stage is associated with a communication path of a first power level and the power amplifier further comprises a second power amplifier stage associated with a communication path of a second power level.

24. The cellular phone of claim 23 wherein the power amplifier further includes a second limiter circuit connected to an input of the second power amplifier stage, and responsive to a second input power level threshold being satisfied, the second limiter circuit adds attenuation at the input of the second power amplifier stage.

\* \* \* \* \*